US007518112B2

(12) United States Patent  (10) Patent No.: US 7,518,112 B2
Matsumoto et al.  (45) Date of Patent: Apr. 14, 2009

(54) RADIATION DETECTION CIRCUIT

(75) Inventors: Takashi Matsumoto, Hamura (JP);
Satoshi Hanazawa, Hamura (JP);
Toshihiko Moriwaki, Hinode (JP);
Masakazu Ishibashi, Fukuoka (JP);
Naruaki Kiriki, Fukuoka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/656,478

(22) Filed: Jan. 23, 2007

(65) Prior Publication Data

US 2007/0228279 A1  Oct. 4, 2007

(30) Foreign Application Priority Data

Mar. 30, 2006  (JP)  .............. 2006-093927

(51) Int. Cl.
*G01J 5/06*  (2006.01)
(52) U.S. Cl. .................................. 250/336.1
(58) Field of Classification Search .............. 250/336.1, 250/336.2, 370.09, 238; 378/91, 162
See application file for complete search history.

(56) References Cited

U.S. PATENT DOCUMENTS 5,324,936 A * 6/1994 Ochiai .................. 250/238

| 2002/0050371 | A1 * | 5/2002 | Czjakowski et al. ...... 174/35 R |
| 2003/0127672 | A1 * | 7/2003 | Rahn et al. ................. 257/291 |
| 2004/0056204 | A1 * | 3/2004 | Tanaka et al. .......... 250/370.09 |
| 2006/0065845 | A1 * | 3/2006 | Yamaguchi ............ 250/370.09 |
| 2007/0197017 | A1 * | 8/2007 | Fujimoto et al. ............ 438/617 |

FOREIGN PATENT DOCUMENTS

JP  11-054738 A  2/1999
JP  2006-090827 A  4/2006

* cited by examiner

*Primary Examiner*—David P Porta
*Assistant Examiner*—Kiho Kim
(74) *Attorney, Agent, or Firm*—Miles & Stockbridge P.C.

(57) ABSTRACT

A radiation detection circuit having a multi-channel input used for radiation measurement and capable of canceling cross-talk noise generated from a logic circuit for controlling a channel and enabling low noise radiation measurement easily and precisely. The radiation detection circuit also generates an inverted signal for each of input/output signals needed for controlling its logic and cancels a noise charge generated by coupled capacity between a bonding wire (analog input side in IC package) for connecting its output to another radiation detection circuit and a bonding wire of each of input/output signals of the logic control circuit by generating an inverted noise charge with coupled capacity between the inverted signal and its output when in logic controlling, thereby suppressing the cross-talk noise generated by each of its input/output signals.

17 Claims, 8 Drawing Sheets

RADIATION DETECTION CIRCUIT

CLAIM OF PRIORITY

The present application claims priority from Japanese application JP 2006-093927 filed on Mar. 30, 2006, the content of which is hereby incorporated by reference into this application.

CROSS-REFERENCE TO RELEASED APPLICATION

This application is released to U.S. application Ser. No. 11/478728 filed on 3 Jul. 2006, the disclosure of which is hereby incorporated by reference.

FIELD OF THE INVENTION

The present invention relates to a radiation detection circuit to be employed for a nuclear medicine diagnostic apparatus represented by a PET (Positron Emission Tomography) apparatus, particularly to a radiation detection circuit that has successfully reduced noise entered from external at the time of measurement of an energy generated with radiation entered to a detector.

BACKGROUND OF THE INVENTION

Conventionally, a noise canceling method disclosed in (e.g., JP-A No. 54738/1999) has been employed for a circuit used to reduce the influence by noise entered from external in a radiation measuring circuit for detecting incident radiation.

SUMMARY OF THE INVENTION

In prior to the present application, the present inventor et al. have made an examination about noise reduction techniques of conventional charge sensitive amplification circuits required for radiation measurement. Generally, a radiation detection circuit receives a signal with use of a charge sensitive amplifier of which input is high in impedance. In case where the output of the radiation detector is high in impedance just like a semiconductor detector, the connecting line between the detector and the detection circuit also becomes high in impedance. Thus noise has to be prevented by a ground shield between the detector and the input terminal of the detection circuit. On the other hand, in the package of the radiation detection circuit, there exists parasitic capacity of several-fF order between the wire bonding for connecting a signal from the detector and the wire bonding of a logical signal for controlling the radiation detection circuit. And it is physically impossible to eliminate the parasitic capacity completely. The line into which noise (about several fC) is coming through this parasitic capacity cannot be shielded and it remains unshielded unavoidably. Therefore, for example, when measuring a very weak signal in an input range of 5 fC, a noise preventive measure is required. If such noise generated by the logical signal is mixed with an input signal, the S/N ratio is degraded, as well as the sensitivity of the detector itself comes to be lowered. JP-A No. 54738/1999 discloses a method for solving this problem; the radiation detector is provided with a dummy input circuit for preventing entry of external noise. FIG. 1 shows the dummy input circuit.

However, because the circuit disclosed in JP-A No. 54738/1999 requires such a dummy input for each input signal, a dummy input signal comes to be provided for each of 10,000 to 100,000 detectors, for example, in a PET apparatus. This is not realistic to solve the above problem. Under such circumstances, the present inventor et al. have solved those conventional problems with an original technique to be described below.

An example of typical features of a radiation detection circuit of the present invention is as follows. The radiation detection circuit of the present invention is connected to an output side of a radiation detector and inputs a strong charge signal from the radiation detector according to an incident energy of radiation and outputs incident energy information and incident timing information according to an intensity of the charge signal. And because a logic control circuit reads both the incident energy information and the incident timing information from the radiation detection circuit and resets those information items, the logic control circuit comes to require a desired control signal input. Furthermore, because there is certain coupled capacity between bonding wires in an IC package, a noise charge QN0 is generated at an output logic signal change by the coupled capacity CXO between an input signal from the radiation detector and an input signal from the logic control circuit, as well as by a logic amplitude voltage. At the time of such an output logic signal change, a noise charge QN2 is also generated by coupled capacitor CX2 between an input signal from the radiation detector and an output signal to the logic control circuit. On the other hand, an inversion logic circuit INV1 is provided in the semiconductor IC and the INV1 inverts an input signal from the logic control circuit and outputs the inverted signal to a terminal of the IC package. And because the inversion logic signals are disposed adjacently, the coupled capacity CX0 generated between each of the signal lines and the radiation detector becomes equal to the CX1 in quantity. Consequently, the noise charge of the output voltage of the charge sensitive amplifier is canceled by the noise charge QN0 generated by an operation of the logic control circuit and an inverted noise charge QN1 generated by an inverted logic signal. In the same way, a noise charge QN2 generated by the coupled capacity CX2 between an input signal from the radiation detector and an output signal to the logic control circuit and by an inverted noise charge generated by the CX3 between an input signal from the radiation detector and an inverted logic signal are canceled each other.

More concretely, the radiation detection circuit of the present invention is connected to the output side of the radiation detector, inputs a strong charge signal from the radiation detector according to an incident energy of the radiation, and outputs both incident energy information and incident timing information of the radiation according to an intensity of the charge signal. The radiation detecting circuit is formed as a semiconductor integrated circuit on a single semiconductor substrate and structured so as to generate an inverted signal for each of input/output signals used for controlling the logic of the radiation detection circuit in the semiconductor integrated circuit and use the inverted signal when in logic controlling to cancel a noise charge generated by the coupled capacity between the bonding wire at the analog input side for connecting the output of the radiation detector to the radiation detection circuit in the package of the semiconductor integrated circuit and the bonding wire of each of the input/output signals with use of an inverted noise charge generated by the coupled capacity between the inverted signal and the output of the radiation detector.

According to the present invention, therefore, the noise of the radiation detection circuit can be reduced, thereby the radiation measurement energy resolution and the accuracy of counting are improved.

DETAILED DESCRIPTION OF THE PREFERRED EMBODIMENTS

Figure 1:
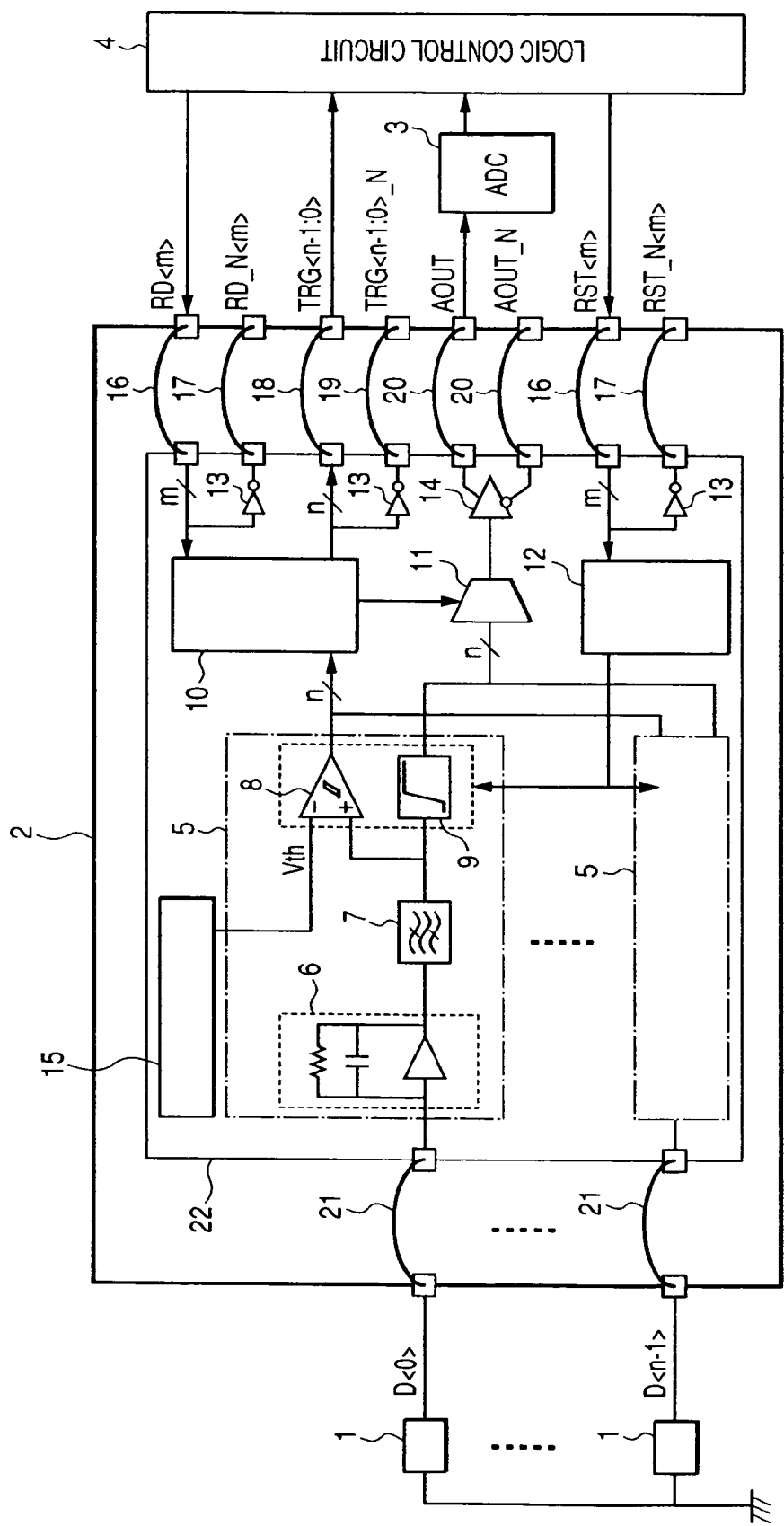
FIG. 1 is a circuit diagram of a detection unit including a radiation detection circuit of the present invention in an embodiment.

Hereunder, the preferred embodiments of the present invention will be described in detail with reference to the accompanying drawings. In all the accompanying drawings, the same reference numerals will be used for the circuits having the same functions, avoiding redundant description. Although not limited specially, the circuit elements of each block in each embodiment are formed on a single semiconductor substrate made, for example, of single crystal silicon with use of such an integrated circuit technique for a known CMOS (complementary type MOS transistor). Numerals of a MOSFET (Metal Oxide Semiconductor Field Effect Transistor) circuit are used as follows; a numeral with no arrow denotes an N-type MOSFET (NMOS) and a numeral with an arrow denotes a P-type MOSFET (PMOS). Hereinafter, a MOSFET will be referred to as a MOS to simplify the description. The transistor elements used for the radiation detection circuit of the present invention are not limited only to field effect transistors (MOSFETs) that include an oxide film/insulation film provided between a metal gate and a semiconductor layer respectively. They may be any of various known types of transistors such as bipolar transistors and MISFETs (Metal Insulator Semiconductor Field Effect Transistors).

First Embodiment

FIG. 1 is a circuit diagram of a radiation detection unit in a nuclear medicine diagnostic apparatus to which a radiation detecting circuit of the present invention is applied in an embodiment. This detection unit comprises a detector 1, a radiation detection circuit 2, an ADC3 (Analog Digital Converter), and a logic control circuit 4. The logic control circuit 4 should preferably be formed as a well-known FPGA (Field Programmable Gate Array: a gate array of which logic can be changed by software). The present invention is not limited only to that, however. Each of a plurality of detectors 1 is connected to a corresponding charge sensitive type analog signal detection block 5 of the radiation detection circuit 2. A charge sensitive amplifier 6 converts a charge signal output from the detector 1 to a voltage signal with a preset conversion gain. If an input signal from this detector 1 is found to exceed a preset voltage threshold in the comparator 8, a trigger signal 16 is output and a trigger signal 18 is connected to a logic control circuit 4 in a latter stage. An input signal from the detector 1 passes a filter 7 to improve the S/N ratio, then voltage information proportional to the input signal is held in a peak holding circuit 9 and the held voltage information is inputted to an ADC3 in a latter stage through an analog multiplexer 11.

The logic control circuit 4, when detecting a trigger signal, controls the address of the multiplexer 11 and makes AD conversion through a read control circuit 10 to read the radiation detection circuit 2, then reads the ADC3. Ending the reading, the logic control circuit 4 controls a resetting circuit 12 with respect to the signal detection block 5 to reset the signal detected block 5 in the radiation detection circuit 2 from the holding state and make the block 5 stand by for another radiation detection.

Ending reading of the information of the analog block 5, the resetting circuit 12 receives a reset signal from the logic control circuit 4 to reset the block 5.

An inversion logic circuit 13 generates a dummy inverted logic for each digital signal. The digital signal is then sent to an end part of an LSI package. A differential output I/O is used for each analog output signal. In FIG. 1, the ADC3 has a single input. According to the ADC type, however, a differential input type for coupling inverted signals is also applicable; it is not limited specially. The comparison/reference voltage of the comparator 8 is distributed to each signal detection block 5 with use of a voltage generated in a threshold control circuit 15.

Figure 2:
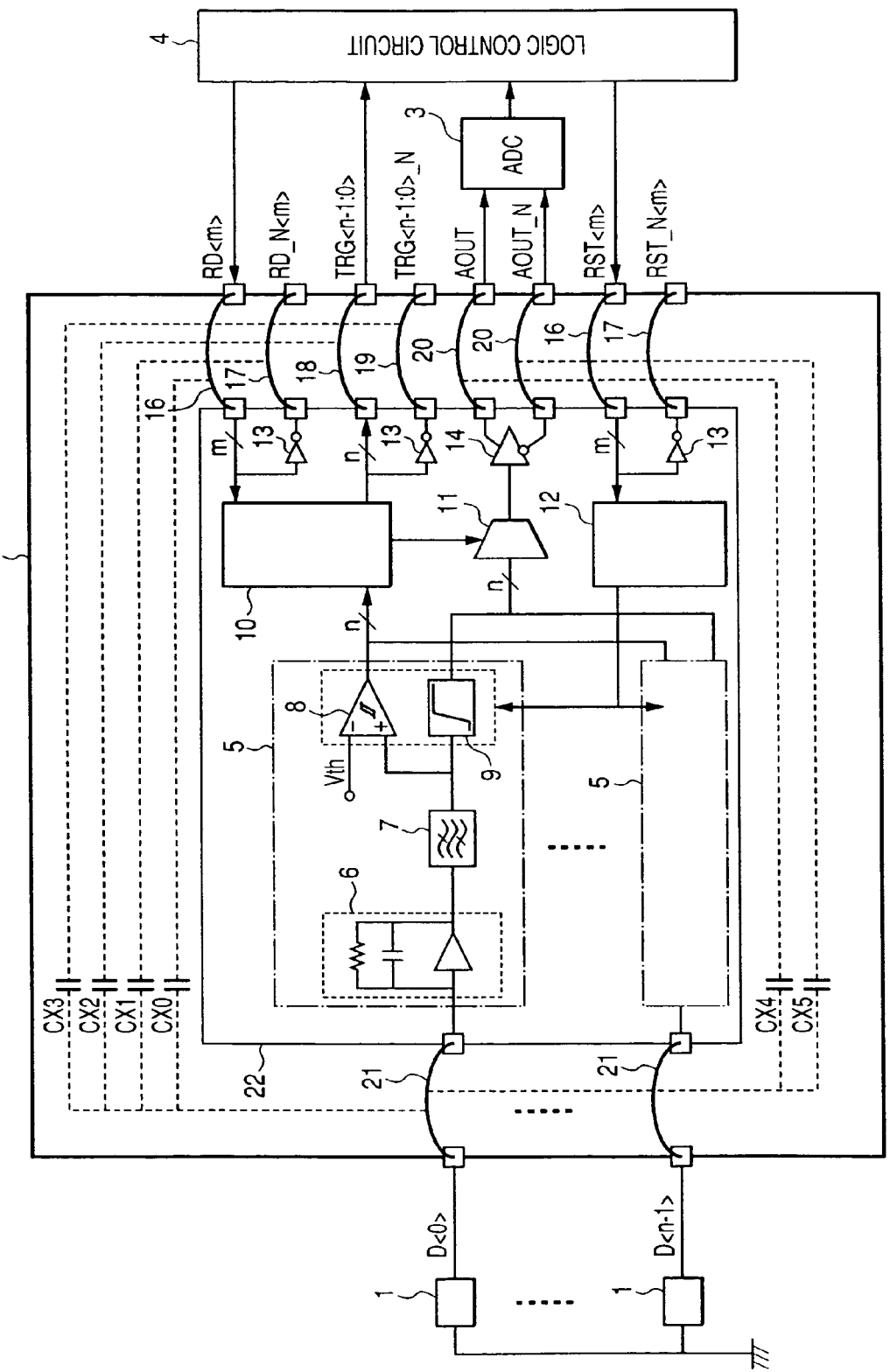
FIG. 2 is a circuit diagram to which the parasitic capacity of an analog signal detection block input part shown in FIG. 1 is added.

FIG. 2 is a circuit diagram shown in FIG. 1 to which the parasitic capacity between an input terminal of the analog signal detection block 5 and another signal is added. The parasitic capacity is determined by a semiconductor package sealing material or a dielectric constant in the air and a distance between wire bondings. In the case of the present invention, the parasitic capacity CX0 exists between the bonding wire 16 of the digital input signal RD<m> and the bonding wire 21 of the analog input signal D<0>. When the RD<m> signal status changes, a noise charge to be determined by a power supply voltage and parasitic capacity is generated. And the parasitic capacity CX1 exists between the bonding wire 17 of the inverted dummy signal RD<m>_N and the bonding wire 21 of the analog input signal D<0>. When the RD<m> signal status changes, an inverted noise charge is generated by an inverted dummy signal.

In the same way, the parasitic capacity CX2 exists between the bonding wire 18 of the digital output signal TRG and the bonding wire 21 of the analog input signal D<0>. When the RD<m> signal status changes, a noise charge determined by a supply voltage and parasitic capacity is generated. And the parasitic capacity CX3 exists between the bonding wire 19 of the inverted dummy signal TRG_N and the bonding wire 21 of the analog input signal D<0>. When the TRG signal status changes, an inverted noise charge is generated by the inverted dummy signal.

The parasitic capacity CX4 and CX5 exist between the bonding wire 20 of the differential analog output signal AOUT/AOUT_N and the bonding wire 21 of the analog input signal D<0>. When the AOUT signal status changes, an inverted noise charge determined by an output amplitude and parasitic capacity is generated.

Figure 3:
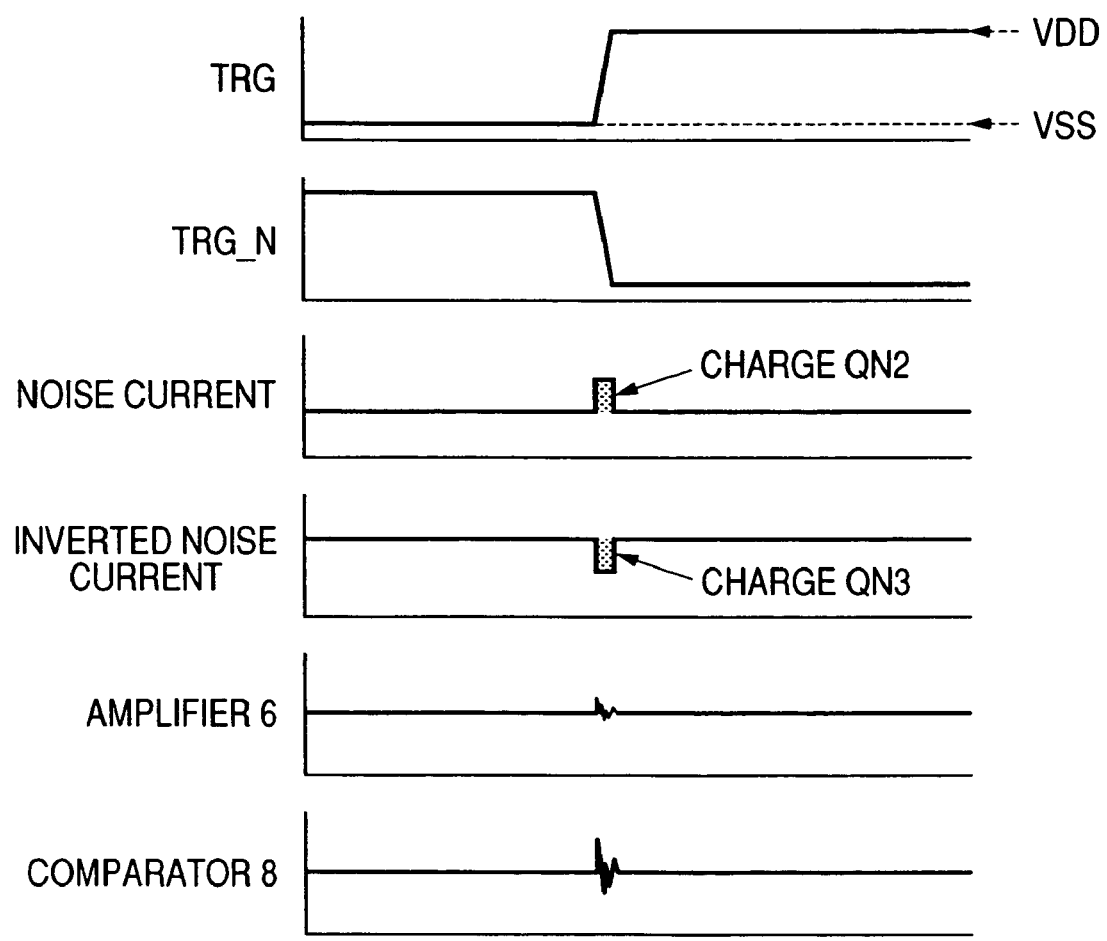
FIG. 3 is a time chart for showing how noise contents detected during a signal I/O operation are canceled each other.

FIG. 3 is a time chart of internal signals when a trigger signal (TRG) output from the level of the radiation detection circuit 2 changes from VSS (logic 0 level) to VDD (logic 1 level) and the charge signal input has a level over a preset voltage threshold. In this case, a noise charge QN2 represented in the expression 1 as follows is generated through the parasitic capacity CX2 existing between the input terminal of the analog signal detection block 5 and the output terminal of the TRG signal. The parasitic capacity CX2 is determined by a semiconductor package sealing material or dielectric constant in the air, and a distance between wire bondings.

$$QN2=CX2\times(VDD-VSS) \qquad \text{[Expression 1]}$$

In other words, the relationship among the noise charge QN2, the parasitic capacity CX2, and the supply voltage level VDD/VSS is represented by the [expression 1]. To cancel the noise charge QN2, if an inverted logic 13 is applied to a trigger signal and an inverted trigger signal (TRG_N) is connected to an external part of the semiconductor package, an inverted noise charge QN3 as represented by [expression 2] is generated between the input terminal of the analog signal detection block 5 and the inverted trigger signal through the capacity CX3 that is equal to CX2.

$$QN3=CX3\times(VSS-VDD) \qquad \text{[Expression 2]}$$

In other words, the relationship among the inverted noise charge QN3, the parasitic capacity CX3, and the supply voltage level VDD/VSS is represented by the [expression 2]. As a result, the input of the analog signal detection block becomes a sum of the noise of two counter phases. Thus the input becomes a fine noise charge as represented by the [expression 3].

$$QN2+QN3=(CX2-CX3)\times(VDD-VSS) \qquad \text{[Expression 3]}$$

Figure 4:
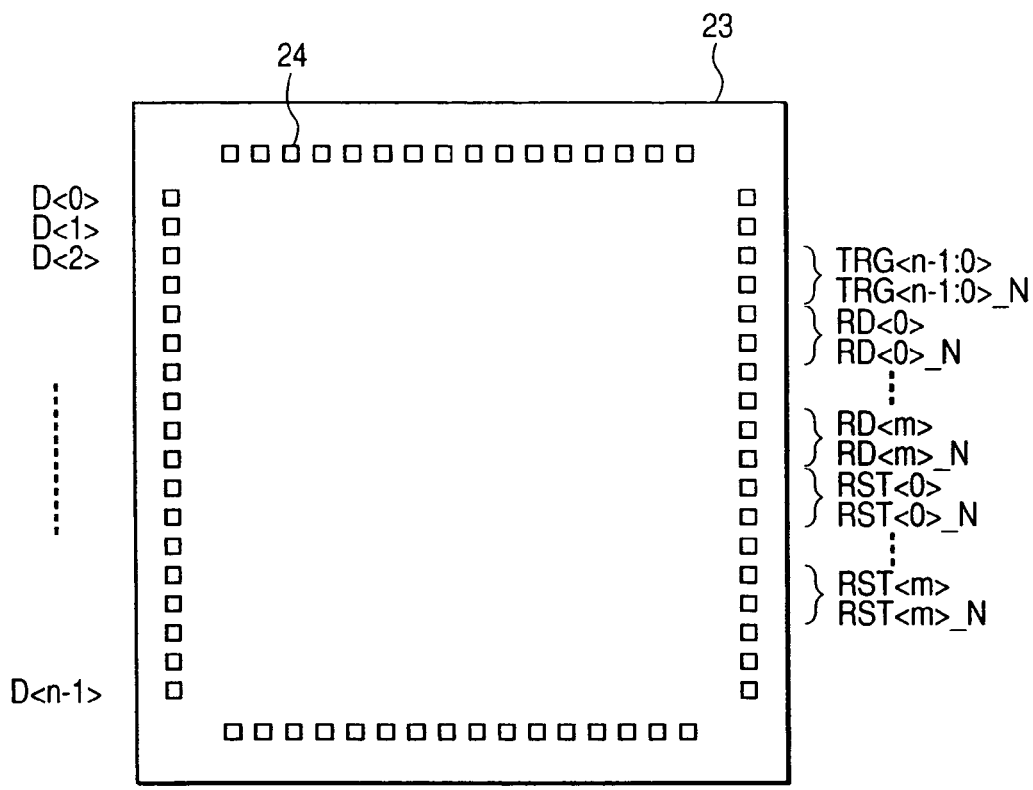
FIG. 4 is a diagram for showing how LSI pads are disposed to reduce noise.

FIG. 4 is a diagram for showing the disposition of pads of the TRG and TRG_N signals of an IC. This trigger signal and its inverted trigger signal are disposed in the farthest positions from the input signal output from the detector in the package and those adjacent trigger signals are paired. Consequently, the difference between the parasitic capacity CX2 and CX3 may be ignored with no problem. The total noise charge superposed on the input from the charge sensitive amplifier 6 becomes fine noise as represented by [expression 4] and it can be canceled.

$$\Delta QN23=\Delta C23\times(VDD-VSS) \qquad \text{[Expression 4]}$$

where $\Delta C23=CX2-CX3$

Figure 5:
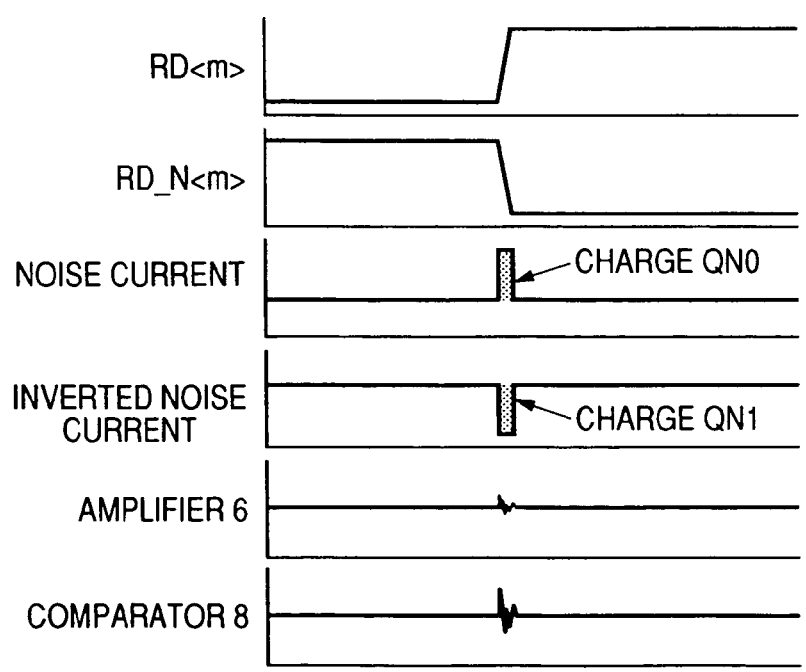
FIG. 5 is a time chart for showing how noise contents detected during I/O operations of signals are canceled each other.

FIG. 5 is a time chart of the read signal (RD<m>) output from the logic control circuit when VSS (logic 0 level) is changed to VDD (logic 1 level). The parasitic capacity CX0 exists as coupled capacitor between the input terminal of the analog signal detection block 5 and the input terminal of the read signal. The CX0 is determined by the semiconductor package or a dielectric constant in the air. And a noise charge QN0 as represented by [expression 5] is generated through this CX0.

$$QN0=CX0\times(VDD-VSS) \qquad \text{[Expression 5]}$$

In other words, the relationship among the noise charge QN0, the parasitic capacity CX0, and the supply voltage level VDD/VSS is represented by [expression 5]. To cancel this noise charge, an inverted logic 13 is applied to the read signal, then the inverted read signal (RD_N<m>) is connected to an external part of the semiconductor package. Parasitic capacity CX1 exists as coupled capacity between the inverted read signal and the output of the radiation detector 1. The CX1 is determined by the semiconductor package or a dielectric constant in the air. Thus the inverted noise charge QN1 as represented by [expression 6] is generated through the coupled capacity.

$$QN1=CX1\times(VSS-VDD) \qquad \text{[Expression 6]}$$

In other words, the relationship among the inverted noise charge QN1, the parasitic capacity CX1, and the supply voltage level VDD/VSS is represented by [expression 6]. This read signal and its inverted read signal are disposed in the farthest positions from the input signal output from the detector in the package and those adjacent read signals are paired. Thus the parasitic capacity CX0 and CX1 may be taken to be almost equal in quantity. Consequently, the noise charge superposed on the input of the charge sensitive amplifier 6 becomes a sum of QN0 and QN1 and they can be canceled each other as represented by $$\Delta QN01=\Delta C01\times(VDD-VSS) \qquad \text{[expression 7]}$$

where $\Delta C01=CX0-CX1$

When controlling reading, the analog signal output AOUT of the analog signal detection block 5 is also processed by a differential output analog buffer to generate an inverted signal AOUT_N, thereby AOUT and AOUT_N become counter output signals having the same amplitude. Consequently, if the parasitic capacity CN4 and CN5 are the same in quantity, the noise charges QN4 and QN5 can be canceled each other.

Such way, because a dummy signal is generated from each of output signals from internal and input signals from external with use of an inversion logic, noise charges generated in the semiconductor package can be canceled each other without requiring any dummy signal from external. This is why low noise radiation measurement is enabled.

Second Embodiment

Figure 6:
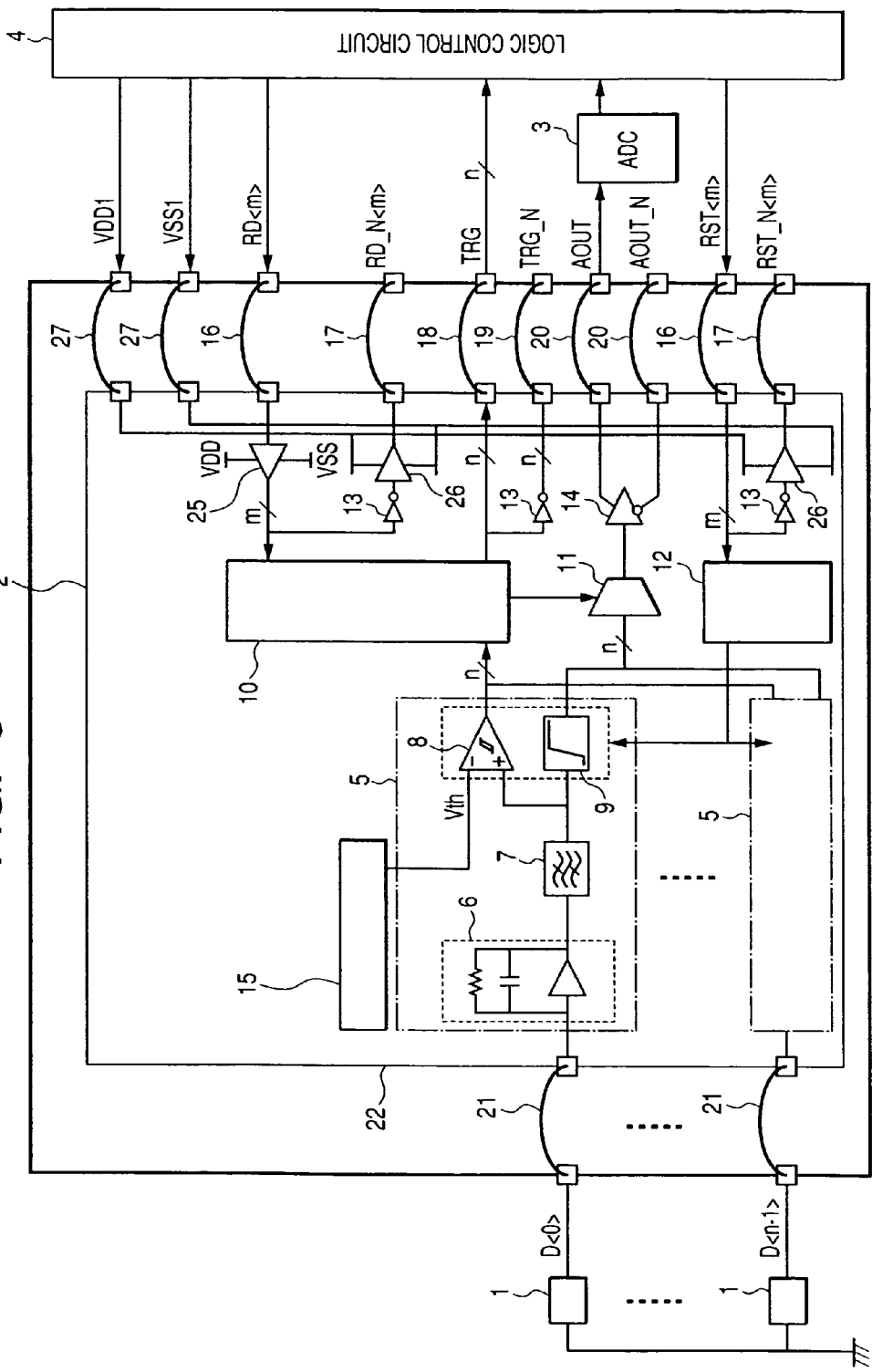
FIG. 6 is a circuit diagram of a variation of a logic control side I/O circuit when the circuit potential differs from that of a logical control IC in a latter stage in a second embodiment.

Hereunder, a radiation detection circuit of the present invention in another embodiment will be described with reference to FIG. 6. In FIG. 6, the same reference numerals will be used for the components having the same functions as those shown in FIG. 1, avoiding redundant description.

The radiation detecting circuit described in the first embodiment cannot operate with a preset supply voltage in some cases due to typically a voltage drop of the logic control circuit in the latter stage. In such a case, a noise charge generated from an input signal of the logic control circuit is determined by parasitic capacity and signal amplitude. Thus the supply voltage is varied among inverted signals generated with internal voltages, thereby a difference is generated between the inverted noise charge and the noise charge. And this difference disables the inverted noise charge and the noise charge to be canceled each other.

[Expression 8] represents a sum of noise charges QN0 and QN1 when the supply voltage (VDD−VSS) of the radiation detection circuit differs from that (VDD1−VSS1) of the logic control circuit.

$$QN0+QN1=CX1\times(VDD1-VSS1)+CX1\times(VSS-VDD) \qquad \text{[Expression 8]}$$

At this time, because VDD≠VDD1 and VSS≠VSS1 are satisfied, the total noise charge is not reduced so much; the charge cannot be ignored.

To solve this problem, it is required to make the input voltage amplitude and the dummy output signal voltage the same just like the input circuit 25 that receives a digital signal from the control circuit. To do so, as shown in FIG. 6, it is just required to drive the dummy inverted signal output circuit 26 with external power supplies VDD1 and VSS1.

The semiconductor detection circuit in this embodiment aims at solving the above problems. And as shown in FIG. 6, an input signal power supply that operates during radiation measurement is supplied from a logic control IC in a latter stage through the wire bonding 27.

Figure 7:
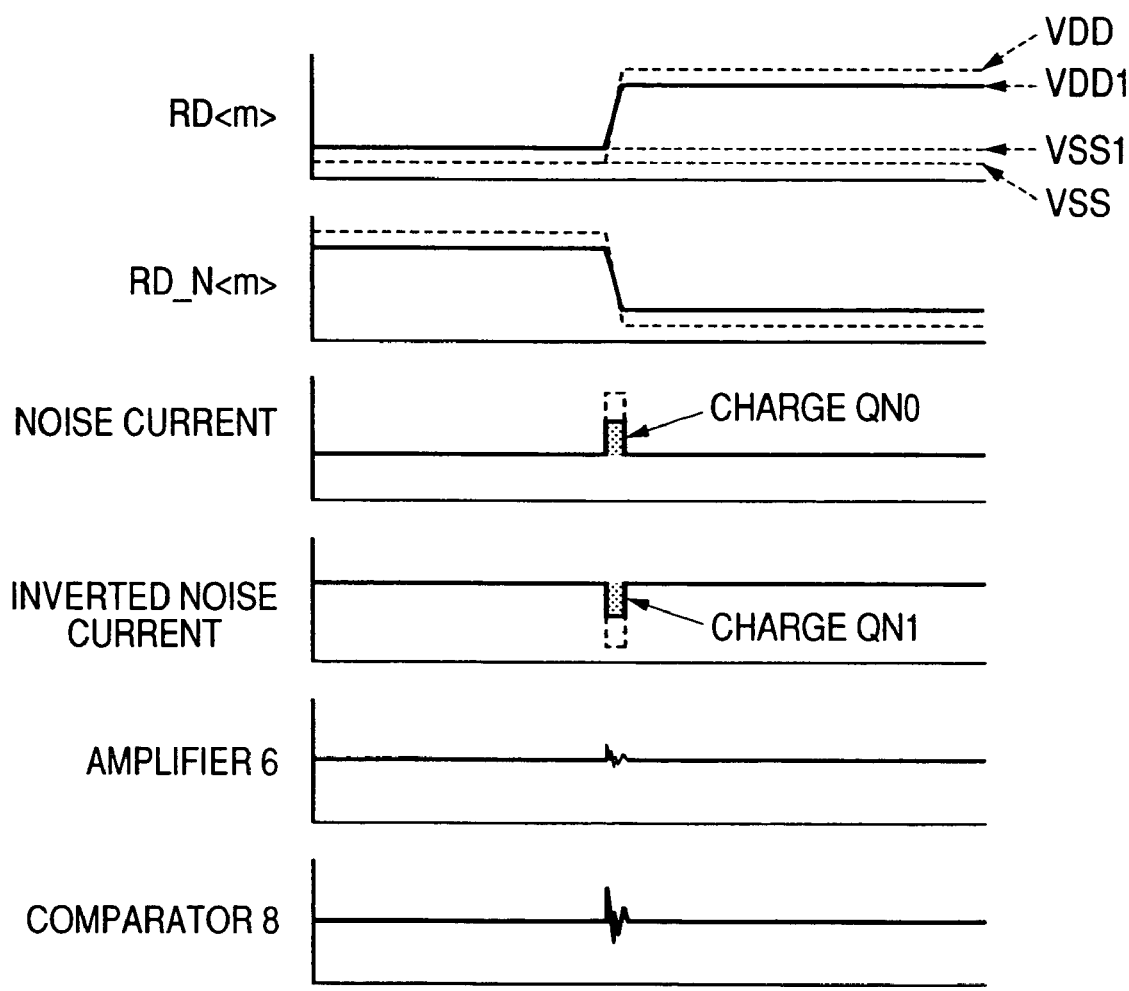
FIG. 7 is a time chart for describing how noise contents detected during I/O operations of signals shown in FIG. 6 are canceled each other.

FIG. 7 is a time chart of the operations of an output circuit that is operating with external power supplies VDD1 and VSS1. It will be understood from this timing chart that the output circuit, when it is driven with external power supplies, enables both timing and noise level of the noise charge QN0 and the inverted noise charge QN1 to become equal, thereby the noise can be canceled each other in a latter stage.

Even when a supply voltage drop occurs, the input signal amplitude and the inverted signal output level match completely. Consequently, as shown in [Expression 9], if the output voltage of the radiation detection circuit matches with the input signal, noise charges can be canceled each other.

$$QN0+QN1=(CX0-CX1)\times(VDD1-VSS1) \qquad \text{[Expression 9]}$$

Third Embodiment

Figure 8A:
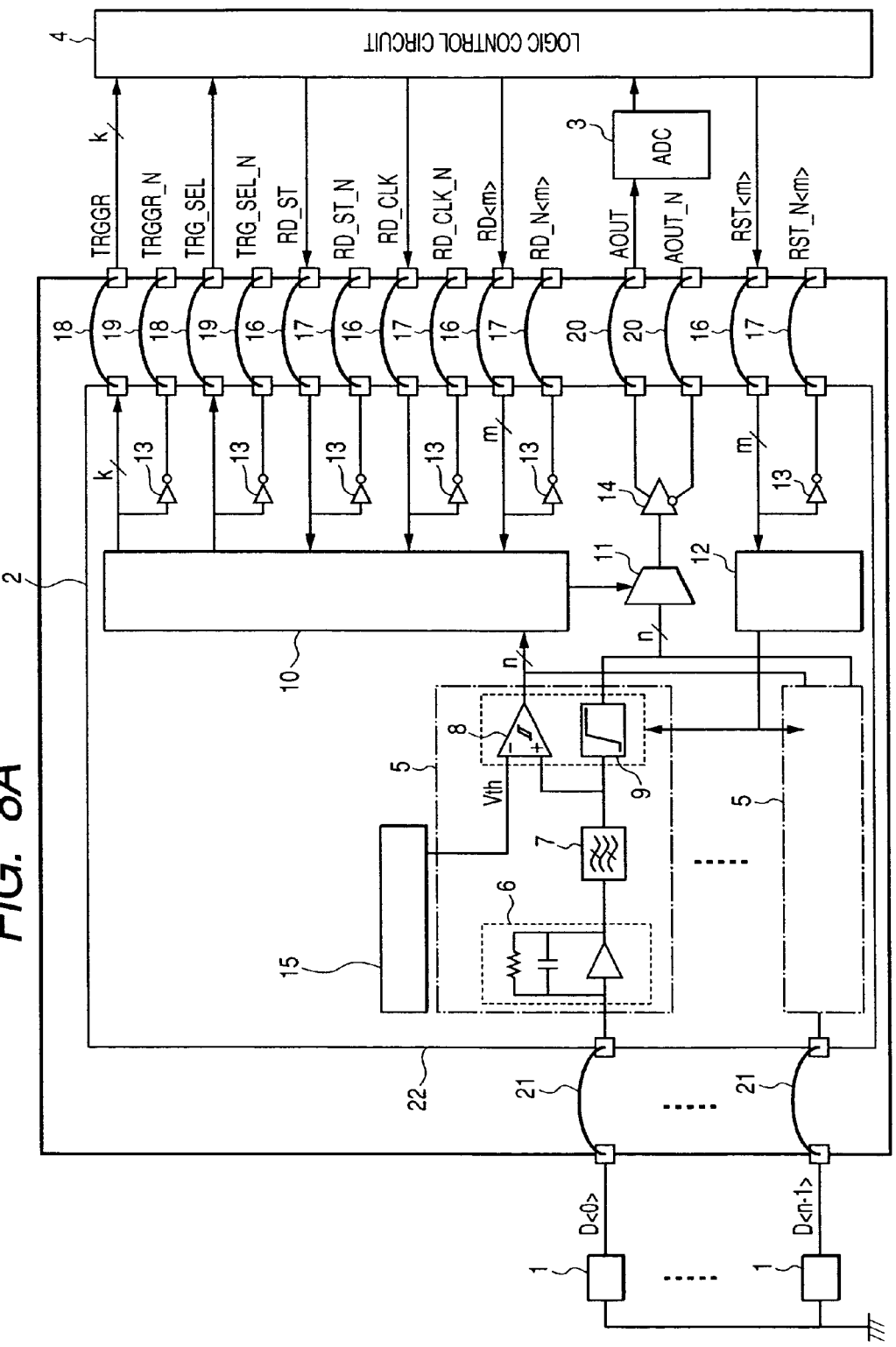
FIG. 8A is a diagram for describing a logic method for suppressing the number of output signals and control logic signals.
Figure 8B:
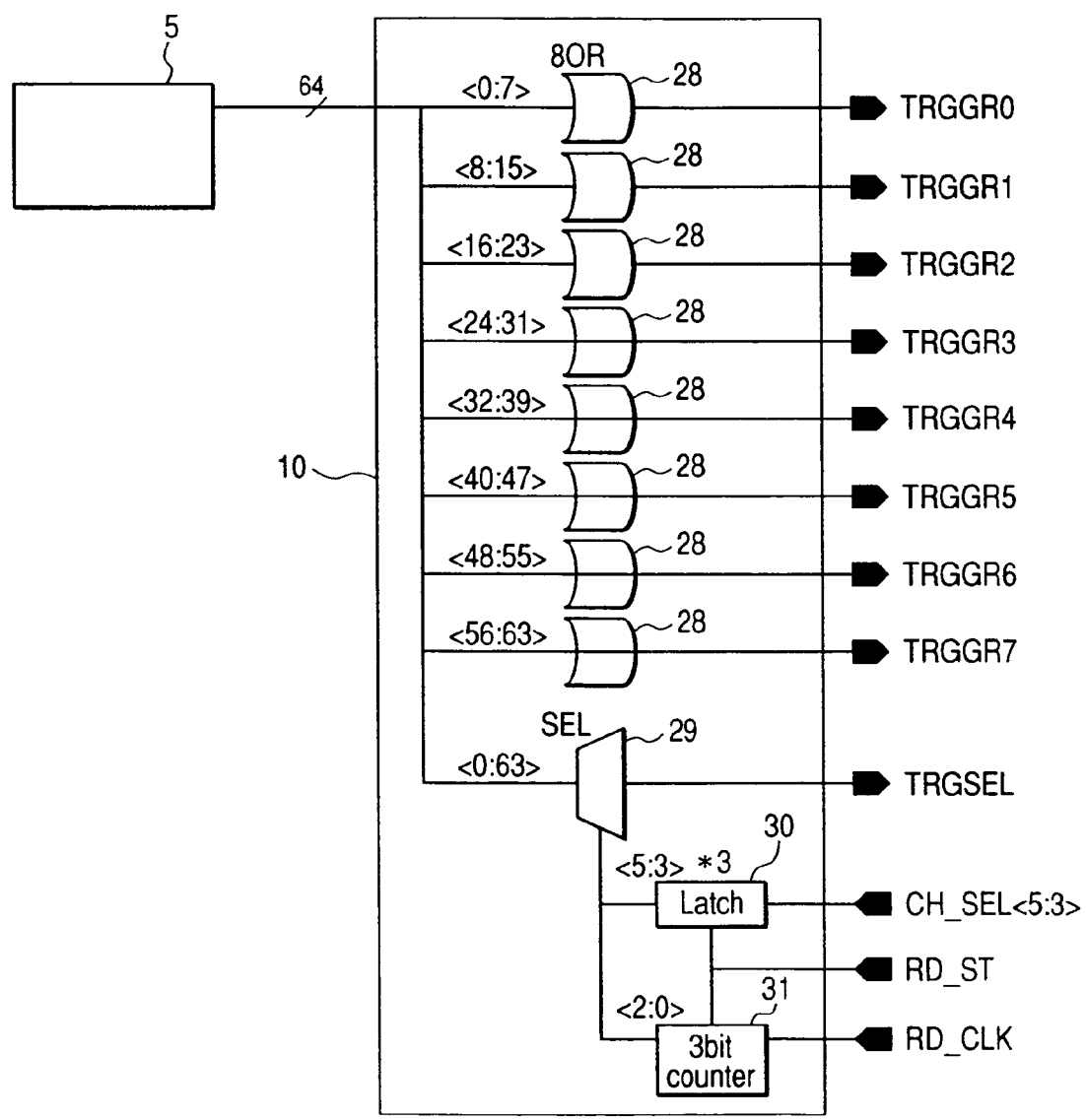
FIG. 8B is a diagram for describing a logic method for suppressing the number of reset control logic signals.

Hereunder, a radiation detection circuit of the present invention in still another embodiment will be described with reference to FIGS. 8A and 8B. In FIGS. 8A and 8B, the same reference numerals will be used for the components having the same functions as those shown in FIGS. 1 and 6, avoiding redundant description.

In the radiation detection circuit described in the first embodiment, each analog input signal assumed as a noise sufferer is disposed as far as possible from each of digital input/output signals assumed as noise assailants while inverted logic signals are disposed adjacently to make their parasitic capacity levels equal and cancel their noise charges each other, thereby enabling low noise measurement. However, because two parasitic capacity levels cannot be made equal completely, some noise that cannot be canceled come to remain.

FIG. 8A is a diagram for showing how noise sources are to be reduced by reducing the number of logic signals used for controlling reading according to the present invention. As shown in FIG. 8A, if the number of analog channels is assumed as 64 and inverted signals are taken into consideration in the 64-signal output method, 128 output I/O pins are needed. On the contrary, this method divides such output signals into 8 groups and a TRG_SEL signal is used for each signal input detected group to detect a detailed channel number with a clock signal. Thus the number of signals used for controlling reading are only 28 even when inverted signals are taken into consideration.

FIG. 8B is a diagram for describing a logical configuration of the read control logic 10 shown in FIG. 8A. Concretely, if each TRGGR signal is detected, the subject group is clarified. Thus the group is selected by CH_SEL<5: 3> and reading is started by an RD_ST signal. A read clock (RD_CLK) is used to search a channel and a select signal consisting of lower 3 bits is generated by a 3-bit counter and used to search 8 channels in the group sequentially. Each selected channel is discriminated by a TRG_SEL signal.

According to this method, the number of required signals that has been 64 conventionally can be reduced to a total of 14, that is, 8 TRGGR signals, 1 TRG_SEL signal, 3 CH_SEL signals, 1 RD_ST signal, and a RD_CLK signal. The number of pins is thus reduced significantly. The number of signals in a group can be selected properly according to a reading time and a system allowable reading time.

Consequently, in the above case, the number of noise sources can be reduced significantly to $28/128$, thereby enabling now noise measurement.

According to each embodiment of the present invention, therefore, the noise of the radiation detection circuit can be reduced, thereby the radiation measurement energy resolution and the counting accuracy can be improved respectively.

What is claimed is:

1. A radiation detection circuit connected to an output side of a radiation detector, inputting a charge signal having a strength according to an incident energy of radiation from said radiation detector, and outputting incident energy information and incident timing information according to an intensity of said charge signal,
   wherein said radiation detection circuit is formed as a semiconductor integrated circuit on a single semiconductor substrate,
   wherein an inverted signal is generated for each of input/output signals required for controlling a logic of said radiation detection circuit,
   wherein said radiation detection circuit is structured so that a noise charge generated by coupled capacity between a bonding wire at an analog input side in a package of said semiconductor integrated circuit and each bonding wire of said input/output signals is canceled by an inverted noise charge generated by coupled capacity between said inversed signal and said output of said radiation detector when in logic controlling,
   wherein a charge sensitive amplifier that is a component of said radiation detection circuit has a single input terminal, and
   wherein said output incident energy information and said output incident timing information are based on an output of said charge sensitive amplifier.

2. The radiation detection circuit according to claim 1, wherein said inverted signal is disconnected from an external logic control circuit for controlling said logic.

3. The radiation detection circuit according to claim 1, wherein said radiation detection circuit is connected to output sides of two or more of said radiation detectors and formed as a semiconductor integrated circuit provided with a plurality of analog input signal processing blocks that are united into one on a single semiconductor substrate.

4. The radiation detection circuit according to claim 1, wherein said input/output signals include a digital input signal for reading and resetting, a digital output signal for transferring information related to a radiation detection time, and an analog voltage signal in proportion to said charge signal inputted from said radiation detector.

5. The radiation detection circuit according to claim 4, wherein said radiation detection circuit is controlled according to said digital input signal during radiation measurement.

6. The radiation detection circuit according to claim 4, wherein said analog voltage signal is output to an analog digital conversion circuit connected to between said radiation detection circuit and an external logic control circuit provided outside said radiation detection circuit, and
   wherein said analog voltage signal transfers an analog voltage signal of a block to be read during radiation measurement after said external logic control circuit reads information from said radiation detection circuit.

7. The radiation detection circuit according to claim 4,
wherein said digital output signal is output from said radiation detection circuit to an external logic control circuit when said charge signal exceeds a preset threshold to notify detection of radiation, and
wherein said radiation detection circuit outputs information related to said radiation detection with use of said digital output signal to said external logic control circuit during radiation measurement.

8. The radiation detection circuit according to claim 1,
wherein said radiation detection circuit further includes a filter coupled to the output of the charge sensitive amplifier, and
wherein said charge sensitive amplifier has functions for converting said charge signal to a voltage signal with a preset conversion gain, inputting said voltage signal to said filter when said voltage signal exceeds a preset voltage threshold, holding said voltage signal output from said filter as voltage information proportional to an intensity of said charge signal, and outputting said held voltage information, as well as a function for outputting incidental time information related to an incident time at which said radiation enters said radiation detector.

9. The radiation detection circuit according to claim 1,
wherein the output impedance of said radiation detector and the input impedance of said charge sensitive amplifier are higher than the output impedance of said radiation detection circuit respectively.

10. The radiation detection circuit according to claim 9,
wherein the connection line between said radiation detector and said radiation detection circuit is electrically shielded.

11. The radiation detection circuit according to claim 1,
wherein the line of said inverted signal and each line of said input/output signals are disposed adjacently, and
wherein said inverted signal is used to generate an inverted noise charge for canceling noise charge generated by coupled capacity between an analog bonding wire for connecting an output of said radiation detector to an input of said radiation detection circuit to a digital bonding wire for connecting said radiation detection circuit to an external logic control circuit for controlling said logic.

12. The radiation detection circuit according to claim 11,
wherein a position where each of said input/output signal lines and said inverted signal line are disposed adjacently is arranged at an opposite side of said analog bonding wire for connecting said radiation detector output to said radiation detection circuit input on said radiation detection circuit.

13. A radiation detection circuit, comprising:
an analog circuit part connected to an output side of a radiation detector; and
a digital circuit part connected to an output side of said analog circuit part,
wherein said analog circuit part has a plurality of analog input wires used to input a signal received from said radiation detector to said analog circuit part respectively,
wherein said digital circuit part has at least one digital input wire used to input a signal received from said external logic control to said digital circuit part, at least one digital output wire used to output a signal generated by said digital circuit part to said external logic control circuit, and a dummy wire corresponding to each of said digital input wire and said digital output wire.

14. The radiation detection circuit according to claim 13,
wherein said analog circuit part input side has an impedance higher than that of its output side.

15. The radiation detection circuit according to claim 14,
wherein the input side of said analog circuit part includes a charge sensitive low noise amplifier.

16. The radiation detection circuit according to claim 13,
wherein said analog circuit part and said digital circuit part are integrated into one on a single semiconductor substrate, and
wherein said radiation detection circuit is formed as a semiconductor integrated circuit.

17. The radiation detection circuit according to claim 16,
wherein said radiation detection circuit formed as said semiconductor integrated circuit and said external logic control circuit are united into one and mounted on a single circuit substrate.

* * * * *